US012555758B2

(12) United States Patent
Shimada

(10) Patent No.: US 12,555,758 B2
(45) Date of Patent: Feb. 17, 2026

(54) FILM FORMING METHOD AND FILM FORMING DEVICE

(71) Applicant: TOKYO ELECTRON LIMITED, Tokyo (JP)

(72) Inventor: Atsushi Shimada, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 18/566,990

(22) PCT Filed: Jun. 7, 2022

(86) PCT No.: PCT/JP2022/023013

§ 371 (c)(1),
(2) Date: Dec. 4, 2023

(87) PCT Pub. No.: WO2022/264887

PCT Pub. Date: Dec. 22, 2022

(65) Prior Publication Data

US 2024/0274420 A1 Aug. 15, 2024

(30) Foreign Application Priority Data

Jun. 17, 2021 (JP) ................................ 2021-101031

(51) Int. Cl.
*H01J 37/34* (2006.01)
*C23C 14/35* (2006.01)

(52) U.S. Cl.
CPC .......... *H01J 37/3452* (2013.01); *C23C 14/35* (2013.01); *H01J 37/3417* (2013.01); *H01J 37/3455* (2013.01); *H01J 2237/332* (2013.01)

(58) Field of Classification Search
CPC ............... H01J 37/3452; H01J 37/3417; H01J 37/3455; H01J 2237/332; C23C 14/35; C23C 14/352
See application file for complete search history.

(56) References Cited

U.S. PATENT DOCUMENTS 6,620,299 B1 * 9/2003 Fietzke ............... H01J 37/3405 204/298.18
2008/0173535 A1 * 7/2008 Krempel-Hesse .......................... C23C 14/3407 204/192.12

(Continued)

FOREIGN PATENT DOCUMENTS

JP 2012-201971 A 10/2012
JP 2016-033244 A 3/2016

(Continued)

OTHER PUBLICATIONS

PCT International Search Report and Written Opinion, PCT Application No. PCT/JP2022/023013, Aug. 16, 2022, 8 pages (with English translation of PCT International Search Report).

*Primary Examiner* — Patrick S Ott
(74) *Attorney, Agent, or Firm* — Fenwick & West LLP

(57) ABSTRACT

There is provided a film forming method for a film forming apparatus which includes: a processing chamber; a plurality of sputtering targets disposed in the processing chamber; and a plurality of magnets respectively disposed at the plurality of targets. The film forming method comprises: during a sputtering process in which a selected target selected among the plurality of targets is subjected to sputtering, performing a selected-side reciprocating operation in which the magnet disposed at the selected target reciprocates in parallel to an extension direction of the selected target; and at the same time, performing at least one of an unselected-side reciprocating operation in which the magnet disposed at an unselected target that is not subjected to the sputtering among the plurality of targets reciprocates in parallel to an extension direction of the unselected target, and a separating operation in which the magnet is separated from the unselected target.

10 Claims, 9 Drawing Sheets

(56) References Cited

U.S. PATENT DOCUMENTS

| | | | | |
|---|---|---|---|---|
| 2010/0006424 | A1* | 1/2010 | Chung | C23C 14/35 204/298.03 |
| 2015/0114835 | A1* | 4/2015 | Gomi | H01J 37/3447 204/298.08 |
| 2015/0136596 | A1* | 5/2015 | Nakamura | H01J 37/3405 204/298.16 |
| 2017/0114448 | A1* | 4/2017 | Mullapudi | C23C 14/352 |
| 2018/0025895 | A1* | 1/2018 | Riker | H01J 37/32082 204/192.13 |

FOREIGN PATENT DOCUMENTS

| | | | |
|---|---|---|---|
| JP | 2016-164287 | A | 9/2016 |
| JP | 2021-025125 | A | 2/2021 |
| KR | 10-2008-0043689 | A | 5/2008 |

* cited by examiner

FILM FORMING METHOD AND FILM FORMING DEVICE

TECHNICAL FIELD

The present disclosure relates to a film forming method and a film forming apparatus.

BACKGROUND

Patent Document 1 discloses a film forming apparatus (sputtering apparatus) for performing sputtering in which a material of a target in a processing chamber is emitted to a substrate by collision between the target and positive ions in plasma. Such a film forming apparatus includes multiple targets for forming a multilayer film on a substrate, and each of the targets has a magnet on a back surface thereof. The film forming apparatus induces plasma to the vicinity of the targets using magnetic field of the magnets during the sputtering.

PRIOR ART DOCUMENTS

Patent Documents

Patent Document 1: Japanese Laid-open Patent Publication No. 2016-033244

SUMMARY

Problems to Be Resolved by the Invention

The present disclosure provides a technique that allows film formation to be performed with higher precision in a film forming apparatus having multiple targets.

Means for Solving the Problems

In accordance with an aspect of the present disclosure, there is provided a film forming method for a film forming apparatus which includes: a processing chamber; a plurality of sputtering targets disposed in the processing chamber; and a plurality of magnets respectively disposed at the plurality of targets, the film forming method comprising: during a sputtering process in which a selected target selected among the plurality of targets is subjected to sputtering, performing a selected-side reciprocating operation in which the magnet disposed at the selected target reciprocates in parallel to an extension direction of the selected target; and at the same time, performing at least one of an unselected-side reciprocating operation in which the magnet disposed at an unselected target that is not subjected to the sputtering among the plurality of targets reciprocates in parallel to an extension direction of the unselected target, and a separating operation in which the magnet is separated from the unselected target.

Effect of the Invention

In accordance with one aspect, a film forming apparatus having multiple targets can perform film formation with higher precision.

DETAILED DESCRIPTION

Figure 1:
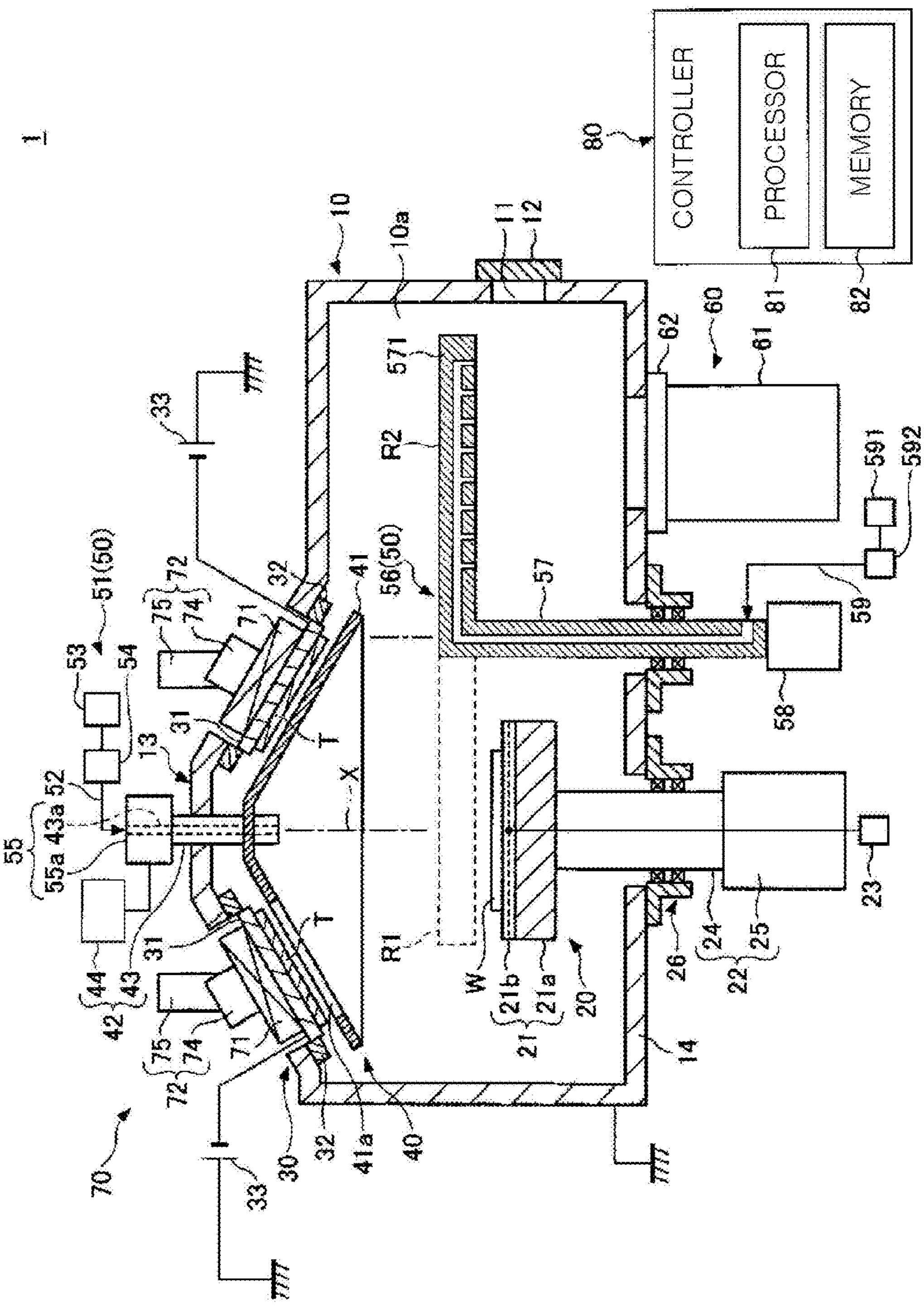
FIG. 1 is a schematic vertical cross-sectional view of a film forming apparatus according to an embodiment.

Hereinafter, embodiments of the present disclosure will be described with reference to the accompanying drawings. In each drawing, like reference numerals will be given to like parts, and redundant description thereof may be omitted.

FIG. 1 is a schematic vertical cross-sectional view of a film forming apparatus 1 according to an embodiment. As shown in FIG. 1, a film forming apparatus 1 according to an embodiment is a physical vapor deposition (PVD) apparatus for forming a film by depositing a material on a semiconductor wafer (hereinafter, simply referred to as "wafer W") that is an example of a substrate.

The film forming apparatus 1 includes a processing chamber 10 having an inner space 10*a*, and performs film formation on the wafer W in the processing chamber 10. The film forming apparatus 1 includes, as a configuration for performing film formation on the wafer W, a stage mechanism part 20, a target holding part 30, a target cover part 40, a gas supply part 50, a gas exhaust part 60, and a magnet mechanism part 70. The film forming apparatus 1 further includes a controller 80 for controlling operations of individual components.

This film forming apparatus 1 is installed as a part of a substrate processing system (not shown). The substrate processing system performs cleaning, etching, or the like, in addition to film formation, on the wafer W. Accordingly, a perpendicular magnetization type magnetic tunnel junction (MTJ) element (magnetoresistive element), for example, is formed on the wafer W. The wafer W having the perpendicular magnetization type MTJ element is applied to magnetic devices such as a MRAM, a HDD, and the like.

Figure 2:
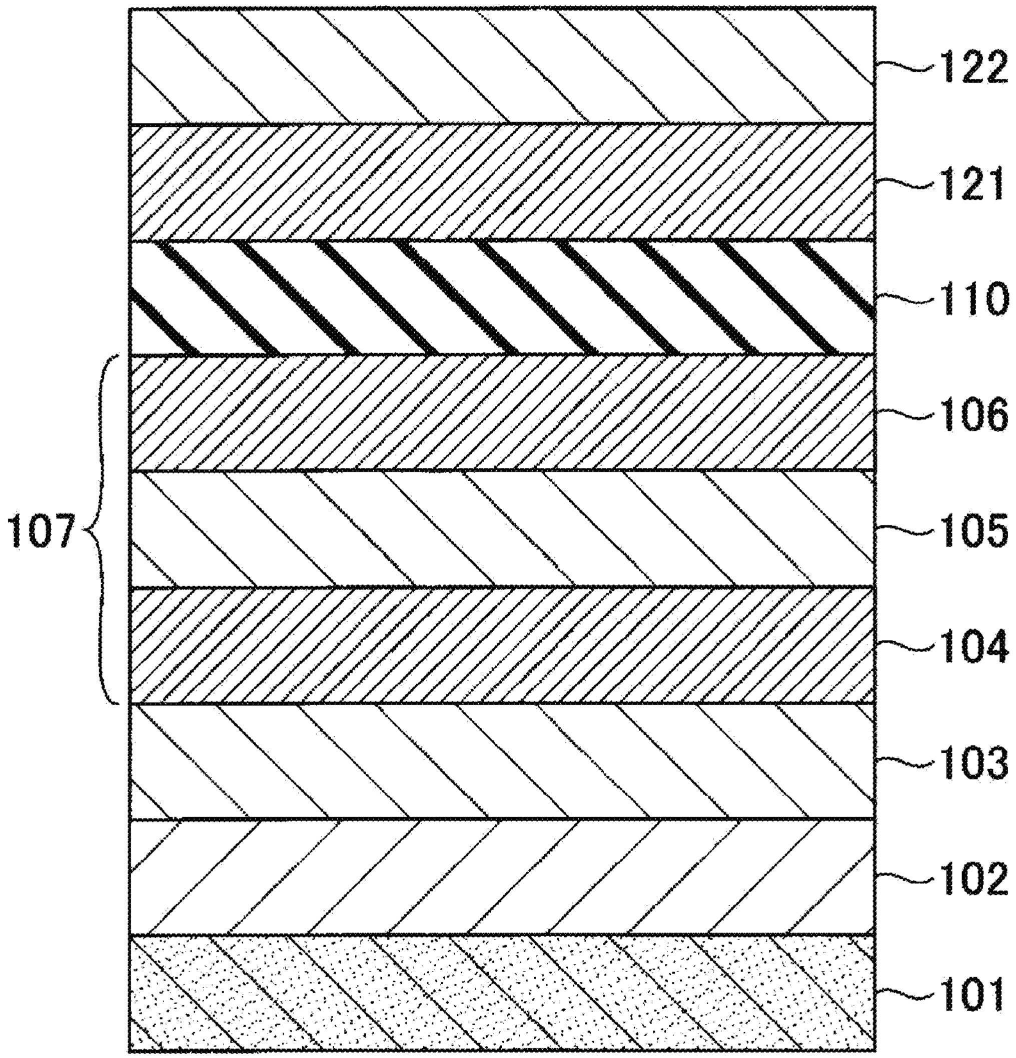
FIG. 2 is a schematic cross-sectional view showing an example of a wafer processed by a substrate processing system.

FIG. 2 is a schematic vertical cross-sectional view showing an example of the wafer W processed by the substrate processing system. As shown in FIG. 2, a substrate 101, a lower electrode 102, a base layer 103, a first magnetic layer 104, a spacer layer 105, and a second magnetic layer 106, a tunnel barrier layer 110, a free layer 121, and a cap layer 122 are stacked, as elements on a processed wafer W, in that order from a lower layer toward an upper layer.

The substrate 101 is, for example, a Si substrate. The lower electrode 102 is made of a conductor such as a metal or the like. The base layer 103 is formed by laminating a Ta film and a Ru film, for example.

The first magnetic layer 104 forms antiferromagnetic coupling with the second magnetic layer 106 via the non-magnetic spacer layer 105, and fixes the magnetization direction of the second magnetic layer 106. In other words, the first magnetic layer 104, the spacer layer 105, and the second magnetic layer 106 constitute a fixed layer 107 having a synthetic antiferromagnetic (SAF) structure.

The first magnetic layer 104 is formed of a multilayer film in which Co films and Pt films are alternately laminated, for example. The spacer layer 105 is made of Ru, Rh, Ir, or the like, for example. The second magnetic layer 106 is formed of a CoFeB film, for example. Alternatively, the second magnetic layer 106 is formed by laminating a multilayer film in which Co films and Pt films are alternately laminated, a Ta film, and a CoFeB film, for example.

The tunnel barrier layer 110 is formed of an MgO film. The free layer 121 is formed of a CoFeB film, for example. An MTJ element is formed by the CoFeB film serving as the fixed layer 107 (the second magnetic layer 106), the MgO film serving as the tunnel barrier layer 110, and the CoFeB film serving as the free layer 121. The cap layer 122 is formed by laminating a Ta film and a Ru film, for example.

In the case of forming elements of a substrate processing system, the film forming apparatus 1 according to an embodiment forms a multilayer film in which a magnetic layer (for example, the first magnetic layer 104, the second magnetic layer 106, and the free layer 121) and a nonmagnetic layer (for example, the spacer layer 105 and the tunnel barrier layer 110) are laminated. In the following description, a state in which a magnetic layer is formed in the film forming apparatus 1 for forming a multilayer film will be described. The film forming apparatus 1 may be an apparatus for forming only a magnetic layer.

Referring back to FIG. 1, the processing chamber 10 of the film forming apparatus 1 is made of aluminum, for example, and is connected to a ground potential. The processing chamber 10 includes a loading/unloading port 11 through which the inner space 10*a* and the outside of the processing chamber 10 communicate, and a gate valve 12 for opening/closing the loading/unloading port 11. When the gate valve 12 is opened, the film forming apparatus 1 performs loading/unloading of the wafer W through the loading/unloading port 11 using a transfer device (not shown).

The processing chamber 10 has a processing center axis X that is located at the center of film formation to be performed on the wafer W in the inner space 10*a* and extends along a vertical direction. The processing center axis X is set to pass through the center of the wafer W placed on the stage mechanism part 20. Further, the processing chamber 10 has a pyramidal portion 13 having a substantially pyramidal shape (for example, a substantially quadrangular pyramidal shape, a conical shape, or the like) at a ceiling portion located above the stage mechanism part 20. The processing center axis X is configured to pass through the center (top) of the pyramidal portion 13.

The stage mechanism part 20 includes a placing table 21 disposed in the processing chamber 10, and a support driving part 22 that supports the placing table 21 to be movable. The placing table 21 includes a substantially disc-shaped base portion 21*a*, and an electrostatic chuck 21*b* fixed on the base portion 21*a*.

The base portion 21*a* is made of aluminum, for example. The base portion 21*a* is fixed to the upper end of the support driving part 22, and the electrostatic chuck 21*b* is disposed at a predetermined height position in the inner space 10*a*. The stage mechanism part 20 may include a temperature control mechanism (not shown) for controlling the temperature of the wafer W placed on the placing table 21 by adjusting the temperature of the base portion 21*a*.

The electrostatic chuck 21*b* includes a dielectric film and an electrode embedded in the dielectric film (both not shown). A DC power supply 23 is connected to the electrode of the electrostatic chuck 21*b*. The electrostatic chuck 21*b* generates an electrostatic force at the dielectric film using a DC voltage supplied from the DC power supply 23 to the electrode, and electrostatically attracts the wafer W placed on the upper surface of the electrostatic chuck 21*b*. The center of the upper surface (the surface on which the wafer W is placed) of the electrostatic chuck 21*b* coincides with the processing center axis X.

The support driving part 22 has a columnar support shaft 24 for holding the base portion 21*a*, and an operation part 25 for operating the support shaft 24. The support shaft 24 extends along the vertical direction, and extends from the inner space 10*a* of the processing chamber 10 to the outside of the processing chamber 10 through a bottom portion 14. The shaft center of the support shaft 24 overlaps the processing center axis X.

The operation part 25 is disposed outside the processing chamber 10, and holds the lower end side of the support shaft 24. The operation part 25 rotates the support shaft 24 around the processing center axis X, and raises and lowers (vertically moves) the support shaft 24 under the control of the controller 80. The placing table 21 rotates and vertically moves in the processing chamber 10 by the operation of the operation part 25.

Further, the stage mechanism part 20 has a sealing structure 26 between the bottom portion 14 of the processing chamber 10 and the support shaft 24. The sealing structure 26 seals a gap therebetween while allowing the movement of the support shaft 24. The sealing structure 26 may be, e.g., magnetic fluid seal.

The target holding part 30 of the film forming apparatus 1 holds a plurality of (four in the present embodiment) targets T, which are cathode targets, at positions spaced upward from the placing table 21. The target holding part 30 includes metal holders 31 for respectively holding the targets T, and insulating members 32 for supporting the holders 31 by fixing the outer peripheral portions of the holders 31.

Each target T held by each holder 31 is made of a metal material (for example, Co, Fe, Ni, Pt, Mg, Cu, or the like) containing a film forming substance, and has a rectangular flat plate shape. Further, the film forming apparatus 1 includes the targets T made of different materials, and can form a multilayer film in the processing chamber 10 by performing sputtering while switching the targets T. In the following description, unless otherwise specified, a case in which the target T for sputtering is made of Co that is a magnetic material will be described. The targets T may be made of different metal materials. Alternatively, some or all of the targets T may be made of the same metal material.

Each holder 31 is formed in a rectangular shape that is considerably larger than the target T in plan view. The holders 31 are fixed to the inclined surface of the pyramidal portion 13 via the insulating members 32. Therefore, the holders 31 hold the surfaces (the sputtering surfaces exposed to the inner space 10*a*) of the targets T in a state where they are inclined with respect to the processing center axis X.

Further, the target holding part 30 electrically connects a plurality of power supplies 33 to the targets T held by the holders 31. Each of the power supplies 33 applies a negative DC voltage to the target T connected thereto. The power supplies 33 may be a single power supply that selectively applies a voltage to the targets T.

Figure 3:
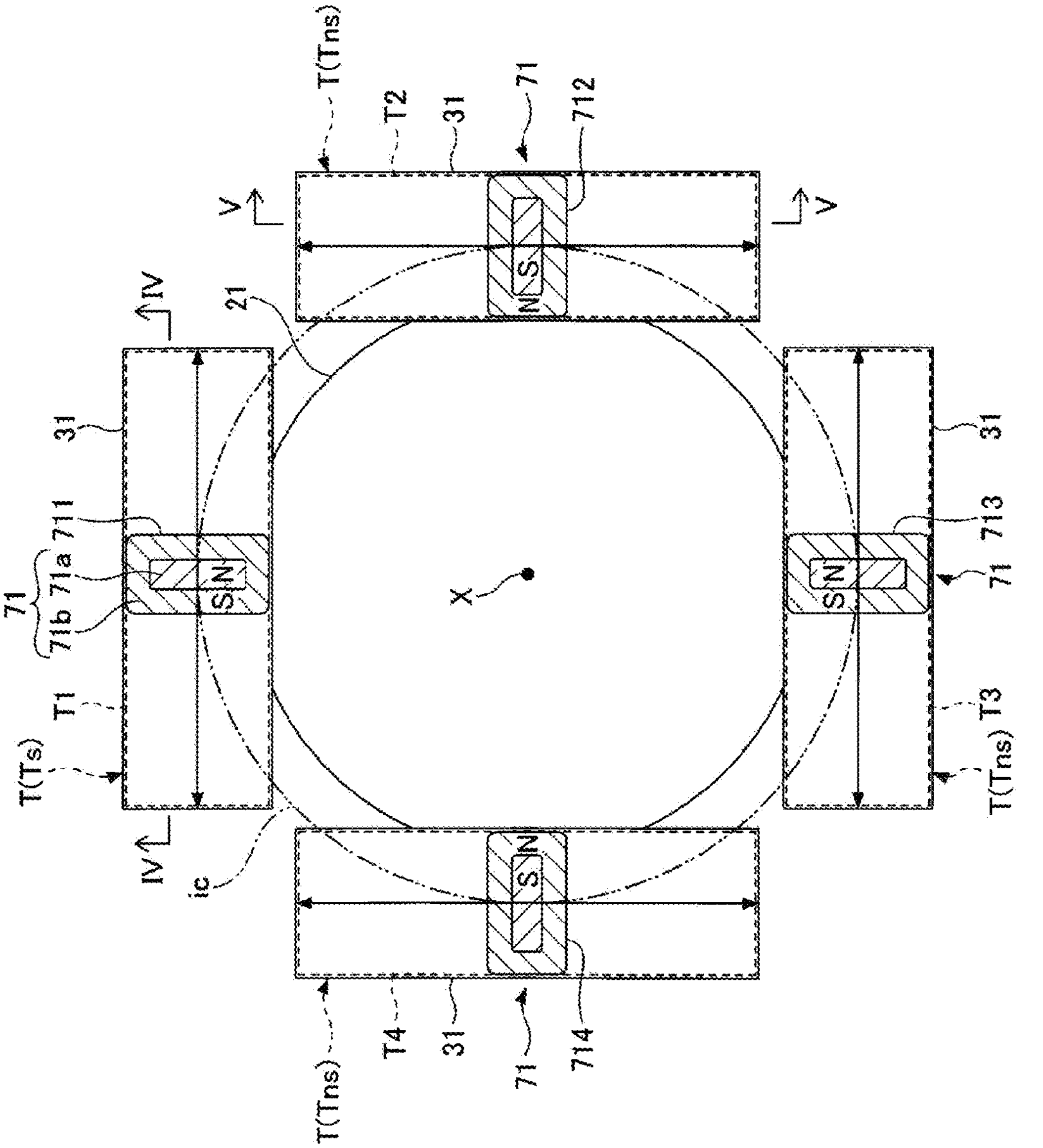
FIG. 3 is a schematic plan view showing the arrangement of four holders and four magnets of the film forming apparatus.

FIG. 3 is a schematic plan view showing the arrangement of four holders 31 and four magnets 71 of the film forming apparatus 1. As shown in FIG. 3, in the target holding part 30, the holders 31 (and the targets T) are arranged at regular intervals along a virtual perfect circle IC centered on the processing center axis X. In other words, the four holders 31 (and the targets T) are arranged at intervals of 90° on the virtual perfect circle IC, and are arranged such that the long side of each holder 31 extends parallel to the tangent to the virtual perfect circle IC. Each of the four targets T is held at the same position as the holder 31 to face diagonally downward (see also FIG. 1).

In the following description, the four targets T may be referred to as a first target T1, a second target T2, a third target T3, and a fourth target T4, in a clockwise direction from the upper position of the virtual perfect circle IC in FIG. 3. For example, in the case of sputtering the first target T1 in film formation, the film forming apparatus 1 sets the first target T1 as a selected target Ts, and sets the second target T2, the third target T3, and the fourth target T4 as unselected targets Tns. The number of targets T and holders 31 of the film forming apparatus 1 are not particularly limited, and may be three or five or more. For example, when the film forming apparatus 1 includes three targets T and three holders 31, they may be arranged at intervals of 120° on the virtual perfect circle IC.

Referring back to FIG. 1, the target cover part 40 of the film forming apparatus 1 includes a shutter main body 41 disposed in the processing chamber 10, and a shutter driving part 42 that supports the shutter main body 41 to be movable.

The shutter main body 41 is disposed between the targets T and the placing table 21. The shutter main body 41 is formed in a pyramidal shape substantially parallel to the inclined surface of the pyramidal portion 13 of the processing chamber 10, and can face the sputtering surfaces of the targets T. Further, the shutter main body 41 has one opening 41*a* that is slightly larger than the target T. The opening 41*a* is disposed to face one target T (the selected target Ts) among the plurality of targets T by the shutter driving part 42. Accordingly, the shutter main body 41 exposes only the selected target Ts to the wafer W on the placing table 21, and prevents the other targets T (the unselected targets Tns) from being exposed.

The shutter driving part 42 has a columnar rotation shaft 43, and a rotation part 44 that rotates the rotation shaft 43. The axial line of the rotation shaft 43 overlaps the processing center axis X of the processing chamber 10. The rotation shaft 43 extends along the vertical direction, and fixes the center (apex) of the shutter main body 41 at the lower end thereof. The rotation shaft 43 projects to the outside of the processing chamber 10 through the center of the pyramidal portion 13.

The rotation part 44 is disposed outside the processing chamber 10, and rotates the rotation shaft 43 relative to the upper end (connector 55*a*) that is holding the rotation shaft 43 via a rotation transmitting part (not shown). Accordingly, the rotation shaft 43 and the shutter main body 41 rotate around the processing center axis X. Hence, the target cover part 40 can adjust the circumferential position of the opening 41*a* under the control of the controller 80, and can make the opening 41*a* face the selected target Ts to be sputtered.

The gas supply part 50 of the film forming apparatus 1 includes an excitation gas part 51 disposed at the pyramidal portion 13 to supply an excitation gas, and an oxidizing gas part 56 disposed on the bottom portion 14 side of the processing chamber 10 to supply a gas for oxidation (hereinafter, referred to as an oxidizing gas). The film forming apparatus 1 may not include the oxidizing gas part 56 when oxidization of a metal deposited on the wafer W is not performed (for example, when a film is formed using only a magnetic material).

The excitation gas part 51 includes a line 52 through which a gas flows outside the processing chamber 10, and also includes a gas source 53, a flow rate controller 54, and a gas introducing part 55 disposed in that order from the upstream side toward the downstream side of the line 52. The gas source 53 stores an excitation gas (e.g., Ar gas), and discharges the gas into the line 52. The flow rate controller 54 is, e.g., a mass flow controller or the like, and adjusts the flow rate of a gas supplied into the processing chamber 10. The gas introducing part 55 introduces a gas into the processing chamber 10 from the outside. The gas introducing part 55 includes the connector 55*a* connected to the line 52 outside the processing chamber 10, and a gas channel 43*a* formed in the rotation shaft 43 of the target cover part 40.

On the other hand, the oxidizing gas part 56 includes a head member 57 for discharging an oxidizing gas (e.g., oxygen), and a rotation device 58 for rotating the head member 57. The oxidizing gas part 56 injects an oxidizing gas from the head member 57 toward the wafer W on the placing table 21 at the time of oxidizing the metal of the nonmagnetic layer. The head member 57 is connected to an oxidizing gas line 59 outside the processing chamber 10. The line 59 is provided with an oxidizing gas source 591 and a flow rate controller 592 for adjusting the flow rate of the oxidizing gas. The rotation device 58 displaces an oxidizing gas injector 571 of the head member 57 between an opposing region R1 facing the placing surface of the placing table 21 and a retreat region R2 separated from the placing table 21.

On the other hand, the gas exhaust part 60 of the film forming apparatus 1 includes a vacuum pump 61, and an adapter 62 for fixing the vacuum pump 61 to the bottom portion 14 of the processing chamber 10. The gas exhaust part 60 decreases a pressure in the inner space 10*a* of the processing chamber 10 under the control of the controller 80.

The magnet mechanism part 70 of the film forming apparatus 1 has a function of inducing plasma to the targets T by applying magnetic field H to the targets T. The magnet mechanism part 70 includes, for each of the holders 31, a magnet 71 (cathode magnet) and an operation part 72 that holds the magnet 71 to be movable. The film forming apparatus 1 according to the present embodiment includes four magnets 71 and four operation parts 72 for holding the respective magnets 71 to correspond to four holders 31.

Figure 4:
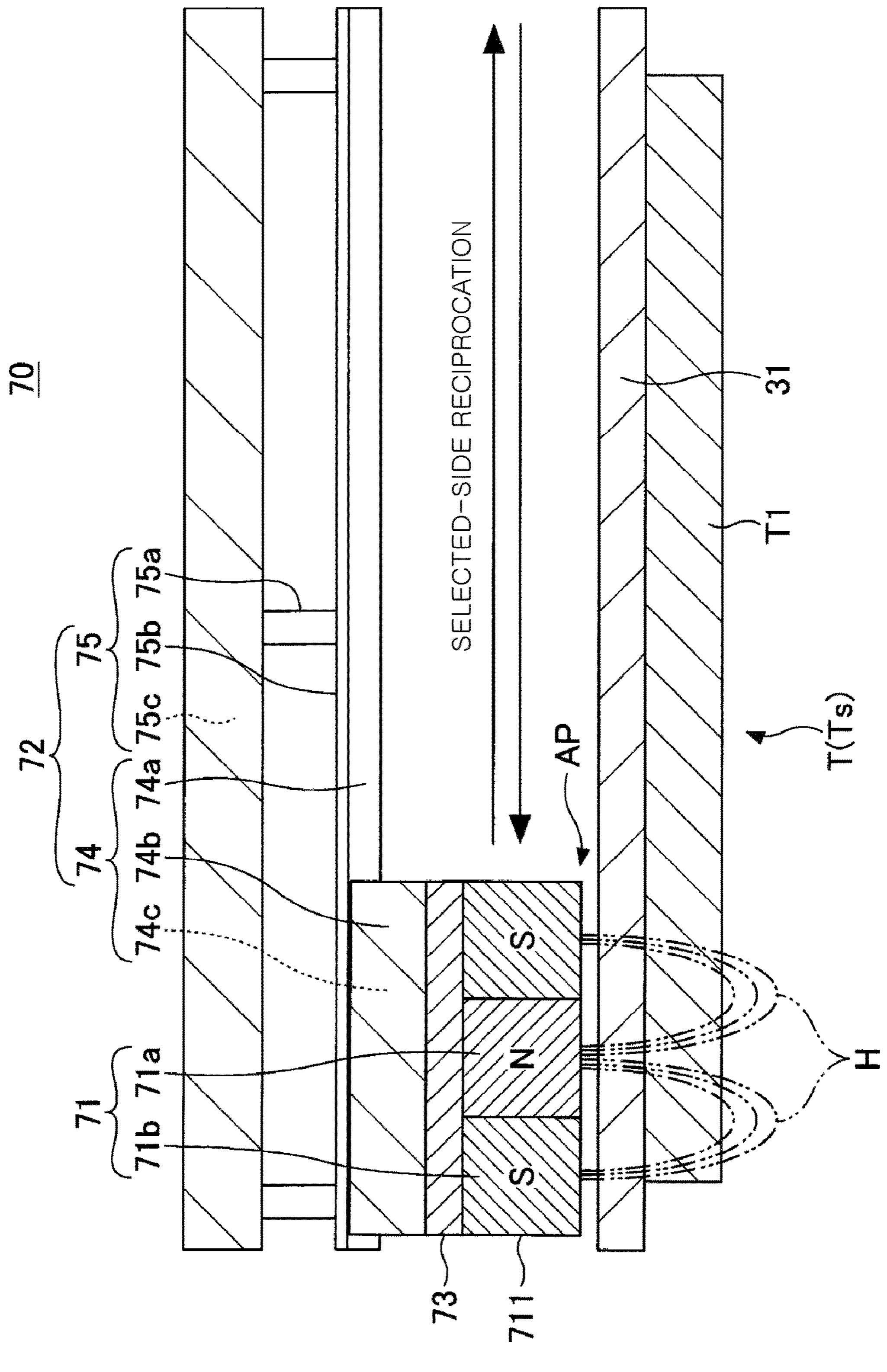
FIG. 4 is a schematic side view showing a target (selected target), a holder, a magnet, and an operation part.

FIG. 4 is a schematic vertical cross-sectional view (cross-sectional view taken along line IV-IV of FIG. 3) showing the target T (the selected target Ts), the holder 31, the magnets 71, and the operation part 72. As shown in FIG. 4, at the outside of the processing chamber 10, the magnets 71 are held by the operation parts 72 to face the respective holders 31 without being in contact therewith. Specifically, the magnets 71 are arranged such that the bottom surfaces (opposing surfaces) of the magnets 71 become parallel to the holders 31 and the targets T to correspond to the inclination of the holders 31 fixed to the pyramidal portion 13. Accordingly, each magnet 71 moves relative to each target T without interfering with the holders 31 for holding the targets T.

Each magnet 71 is held by each operation part 72 via a yoke 73 that induces magnetic force. The shape of the yoke 73 is not particularly limited as long as the magnetic field H of the magnets 71 can be appropriately induced to the targets T adjacent to the corresponding magnets 71.

As shown in FIG. 3, the four magnets 71 are arranged to overlap the targets T on the virtual perfect circle IC. In the following description, the four magnets 71 may be referred to as a first magnet 711, a second magnet 712, a third magnet 713, and a fourth magnet 714 in a clockwise direction along the four targets T (the first to fourth targets T1 to T4).

The magnets 71 are formed in the same shape, and configured to generate the same magnetic force. Specifically, each magnet 71 has a substantially rectangular shape in plan view. In the holding state of the operation part 72, the long side of the magnet 71 extends parallel to the short side direction of the rectangular target T, whereas the short side of the magnet 71 extends parallel to the long side direction of the rectangular target T.

Each magnet 71 may be a permanent magnet. The material of each magnet 71 is not particularly limited as long as it has an appropriate magnetic force, and may be, e.g., iron, cobalt, nickel, samarium, neodymium, or the like.

Further, each magnet 71 is magnetized to have a first magnetic pole 71*a* on the inside (at the center) thereof and a second magnetic pole 71*b*, which is a magnetic pole opposite to the first magnetic pole 71*a*, on the outer side of the first magnetic pole 71*a*. The second magnetic pole 71*b* revolves around the entire circumference of the first magnetic pole 71*a*. In other words, in cross-sectional view taken along the short side direction or the long side direction, the second magnetic pole 71*b*, the first magnetic pole 71*a*, and the second magnetic pole 71*b* of the magnet 71 are arranged in that order (see also FIG. 4).

The first magnetic poles 71*a* and the second magnetic poles 71*b* are set to be different between the magnets 71 arranged at adjacent positions along the circumferential direction of the virtual perfect circle IC. In other words, in FIG. 3, if the first magnetic pole 71*a* of the first magnet 711 is an N pole and the second magnetic pole 71*b* is an S pole, the first magnetic poles 71*a* of the second magnet 712 and the fourth magnet 714 become S poles, and the second magnetic poles 71*b* thereof become N poles. Further, in the third magnet 713, the first magnetic pole 71*a* becomes an N pole, and the second magnetic pole 71*b* becomes an S pole.

Each operation part 72 for holding each magnet 71 reciprocates the holding magnet 71 along the longitudinal direction of the target T, and moves the holding magnet 71 to be separated from or close to the target T. Specifically, each operation part 72 includes a reciprocating mechanism 74 for holding and reciprocating the magnet 71, and an approaching/separating mechanism 75 for holding and moving the reciprocating mechanism 74 to be separated from or close to the target T.

The reciprocating mechanism 74 includes a rail 74*a* extending in the longitudinal direction of the target T, a movable body 74*b* that holds the magnet 71 and is movable along the rail 74*a*, and a driving main body 74*c* that moves the movable body. The driving main body 74*c* of the reciprocating mechanism 74 moves the movable body 74*b* under the control of the controller 80. The driving main body 74*c* may be, e.g., a ball screw mechanism, a cylinder mechanism, a crank mechanism, a linear stage, or the like.

The reciprocating mechanism 74 moves the magnet 71 in parallel to the holder 31 (i.e., the plane direction of the sputtering surface of the target T) holding the target T by moving the movable body 74*b* along the rail 74*a*. The reciprocating mechanism 74 sets the movement range of the magnet 71 between one longitudinal end and the other longitudinal end of the target T. The reciprocating mechanism 74 reciprocates the magnet 71 between one longitudinal end and the other longitudinal end along the tangential direction of the virtual perfect circle IC under the control of the controller 80.

Hereinafter, in the reciprocating direction of the magnet 71, a direction similar to the clockwise direction of the virtual perfect circle IC will be referred to as a first direction, and a direction similar to the counterclockwise direction of the virtual perfect circle IC will be referred to as a second direction. That is, the first direction is parallel to the tangent line and points towards a clockwise direction of the virtual perfect circle IC, and the second direction is parallel to the tangent line and points towards a counterclockwise direction of the virtual perfect circle IC. In other words, the first magnet 711 reciprocates in a left-right direction by the operation part 72. In this case, the right direction in FIG. 3 is set to a first direction and the left direction in FIG. 3 is set to a second direction. The second magnet 712 reciprocates in a vertical direction by the operation part 72. In this case, the downward direction in FIG. 3 is set to a first direction and the upward direction in FIG. 3 is set to a second direction. The third magnet 713 reciprocates in the left-right direction by the operation part 72. In this case, the left direction in FIG. 3 is set to a first direction, and the right direction in FIG. 3 is set to a second direction. The fourth magnet 714 reciprocates in the vertical direction by the operation part 72. In this case, the upward direction in FIG. 3 is set to a first direction, and the downward direction in FIG. 3 is set to a second direction.

The approaching/separating mechanism 75 includes a guide 75*a* extending in a direction perpendicular to the plane direction of the target T, a movable body 75*b* that holds the reciprocating mechanism 74 and is movable along the guide 75*a*, and a driving main body 75*c* that moves the movable body 75*b*. The actuator described in the driving main body 74*c* of the reciprocating mechanism 74 may be appropriately adopted as the driving main body 75*c* of the approaching/separating mechanism 75, and the driving main body 75*c* moves the movable body 75*b* under the control of the controller 80. Accordingly, the approaching/separating mechanism 75 moves the reciprocating mechanism 74 and the magnet 71 in a direction perpendicular to the plane direction of the target T.

Figure 5:
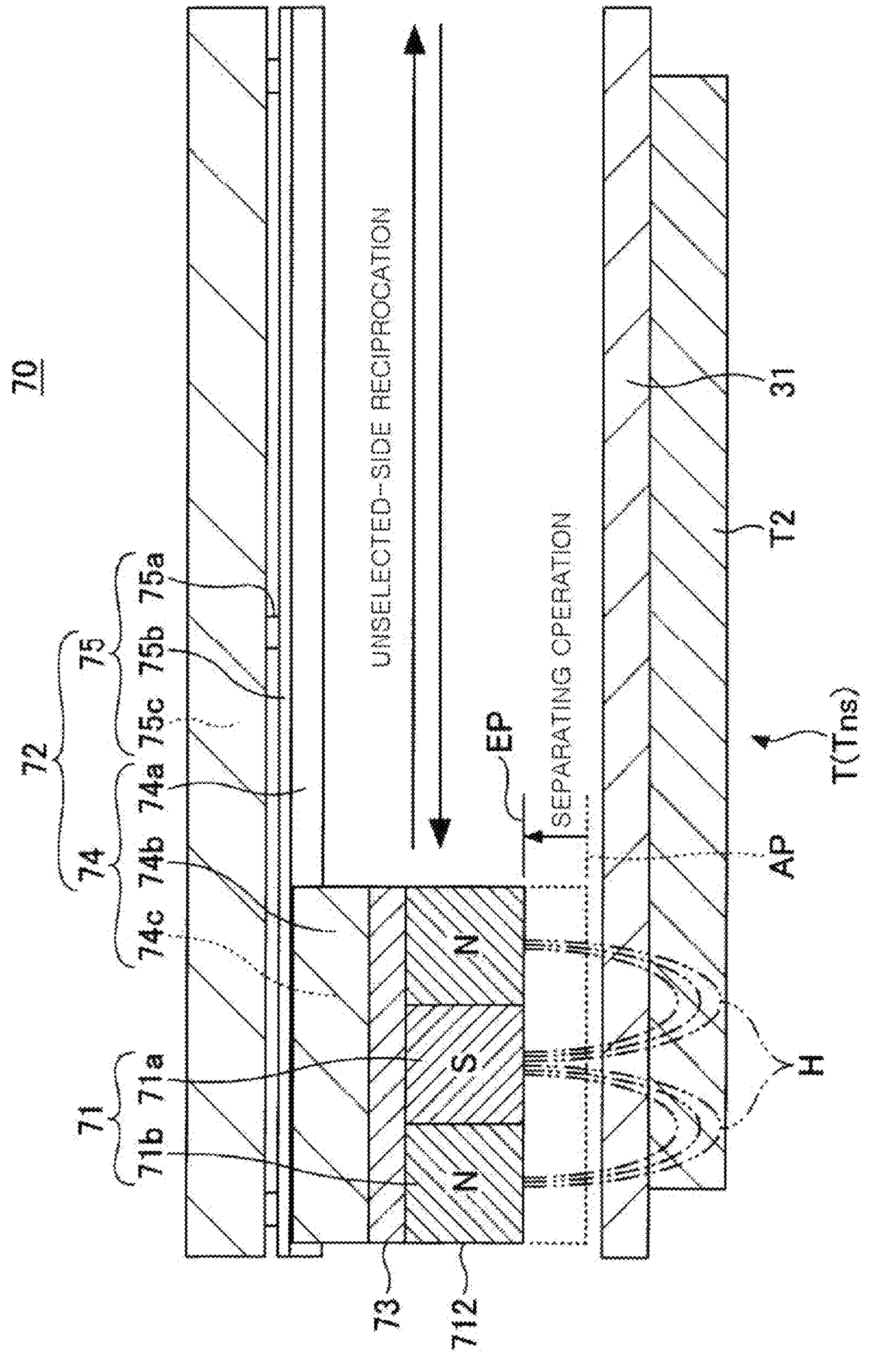
FIG. 5 is a schematic side view showing a target (unselected target), a holder, a magnet, and an operation part.

FIG. 5 is a schematic vertical cross-sectional view (cross-sectional view taken along a line V-V of FIG. 3) showing the target T (the unselected target Tns), the holder 31, the magnet 71, and the operation part 72. As shown in FIG. 5, the approaching/separating mechanism 75 sets the movement range of the magnet 71 between a close position AP that is sufficiently close to the holder 31 and a separated position EP that is separated from the holder 31 compared to the close position AP. The magnetic field H applied to the target T by the magnet 71 that has moved to the separated position EP becomes weaker than the magnetic field H applied to the target T by the magnet 71 at the close position AP.

At the close position AP, the magnetic field H of the magnet 71 acts in the inner space 10*a* over the target T (the selected target Ts). For example, the close position AP may be set to a position where the surface magnetic field of the target T is 20 Oe (=1591.6 A/m) or more.

On the other hand, the separated position EP is preferably a position where the magnetic field H of the magnet 71 is not over the target T (the unselected target Tns), or is within the target T. More specifically, at the separated position EP, the surface magnetic field of the target Tis 10 Oe (=795.8 A/m) or less. The distance between the close position AP and the separated position EP varies depending on the size of the film forming apparatus 1, but is within a range from several mm to several tens of mm, for example.

The controller 80 of the film forming apparatus 1 is a control computer including one or more processors 81, a memory 82, an input/output interface (not shown), and an electronic circuit. One or more processors 81 may be combination of one or more of a central processing unit (CPU), an application specific integrated circuit (ASIC), a field-programmable gate array (FPGA), and a circuit formed of multiple discrete semiconductors. The memory 82 includes a nonvolatile memory and a volatile memory, and constitutes a storage part of the controller 80. Some of the memory 82 may be built in one or more processors 81.

The processor 81 executes a program stored in the memory 82 to perform film formation (sputtering for depositing a metal on the wafer W) of the film forming apparatus 1. During the film formation, the processor 81 controls the operations of individual components of the film forming apparatus 1 based on the recipe stored in the memory 82.

In particular, during the sputtering, the processor 81 according to the present embodiment performs a selected-side reciprocating operation in which the magnet 71 adjacent to the selected target Ts reciprocates at the close position AP in parallel to the extension direction of the selected target Ts. Further, the processor 81 performs a separating operation of separating the magnet 71 adjacent to the unselected target Tns from the close position AP to the separated position EP, and also performs an unselected-side reciprocating operation in which the magnet 71 reciprocates in parallel to the extension direction of the unselected target Tns at the separated position EP.

The film forming apparatus 1 according to the present embodiment is basically configured as described above. Hereinafter, the operation (film forming method) and effects thereof will be described.

Figure 6:
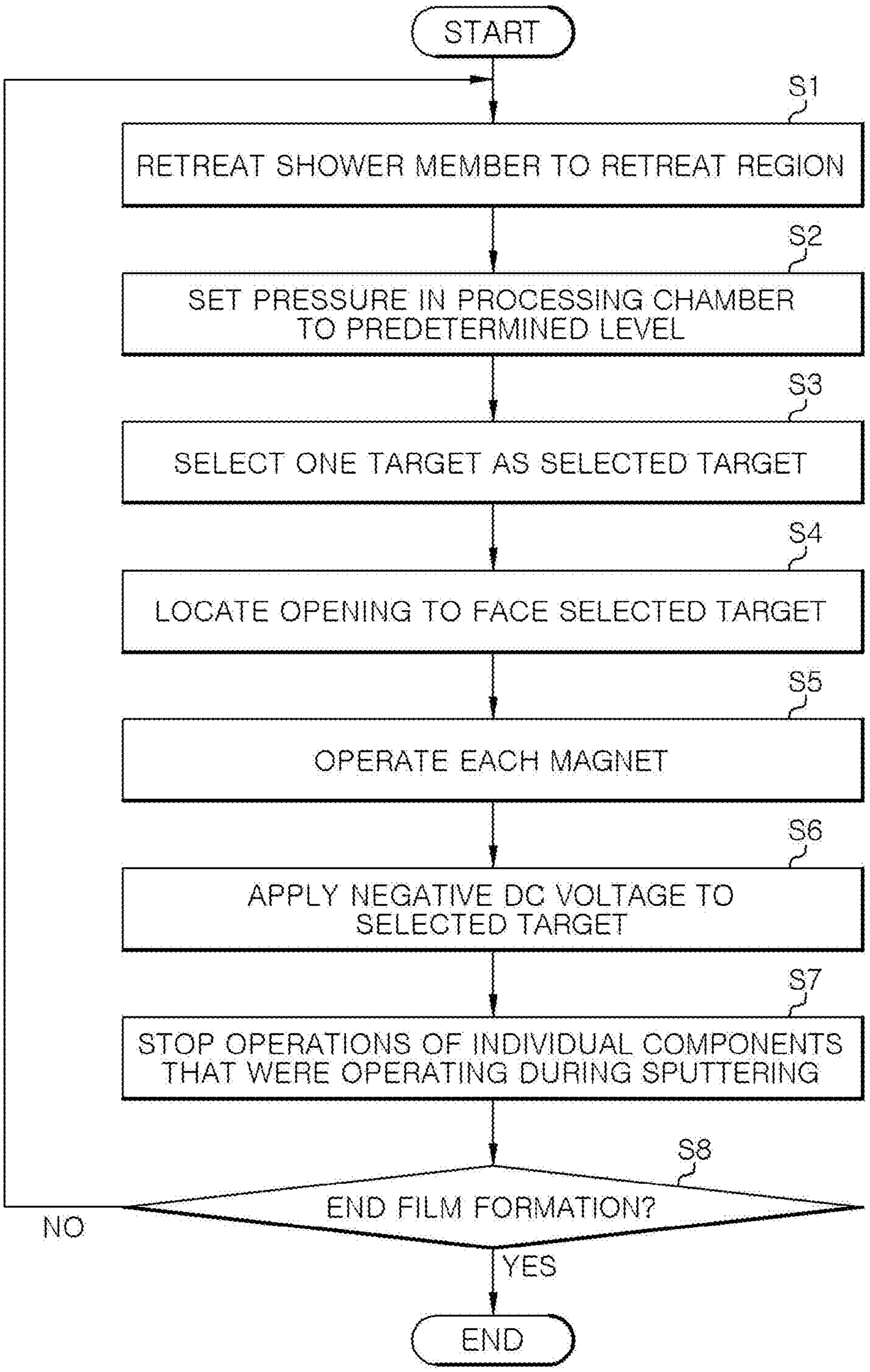
FIG. 6 is a flowchart showing processing flow of a film forming method.

FIG. 6 is a flowchart showing the processing flow of the film forming method. As shown in FIG. 6, in the case of performing the film forming method, first, the controller 80 of the film forming apparatus 1 controls the rotation of the rotation device 58 to retreat the head member 57 to the retreat region R2 separated from the placing table 21 (step S1). Further, the controller 80 controls the flow rate controller 54 to supply an excitation gas at a predetermined flow rate from the excitation gas part 51 into the processing chamber 10, and also controls the gas exhaust part 60 to set a pressure in the processing chamber 10 to a predetermined level (step S2).

Then, the controller 80 selects one target T to be subjected to sputtering, as the selected target Ts, among the plurality of targets T (step S3). Among the plurality of targets T, the targets T other than the selected target Ts become the unselected targets Tns.

The controller 80 controls the rotation of the shutter driving part 42 to make the opening 41*a* face the selected target Ts (Step S4). Accordingly, the shutter main body 41 faces the unselected targets Tns, and prevents the unselected targets Tns from being exposed to the inner space 10*a*.

Further, the controller 80 controls the magnet mechanism part 70 to operate each magnet 71 (step S5). In other words, in the film forming method, the operation of each magnet 71 is started before the sputtering is started, and the operation of each magnet 71 is continued even during the sputtering. The specific operation of each magnet 71 will be described in detail later.

Then, during the operation of each magnet 71, the controller 80 controls each of the power supply 33 connected to the selected target Ts to apply a negative DC voltage to the selected target Ts (step S6). Accordingly, the film forming apparatus 1 generates plasma in the processing chamber 10, and performs sputtering in which positive ions in the plasma collide with the selected target Ts. By performing the sputtering, a metal (for example, Co) is released, as sputtered particles, from the selected target into the inner space 10*a*, and the sputtered particles are deposited on the wafer W.

Next, the controller 80 stops the operations of the individual components (including the magnet mechanism part 70) that were operating during the sputtering (step S7).

Upon completion of step S7, the controller 80 determines whether or not it is necessary to end the film formation (step S8). If it is determined to continue the film formation (step S8: NO), the processing returns to step S1 or step S3, and the same processing flow is repeated. Further, in the case of continuing the film formation to form a multilayer film on the wafer W, the film forming apparatus 1 changes the selected target Ts. For example, the film forming apparatus 1 can form a desired multilayer film by changing the selected target Ts in the order of the first target T1, the second target T2, the third target T3, and the fourth target T4. Further, in the case of forming a metal oxide film (e.g., an MgO film), in the film forming apparatus 1, an oxidizing gas is injected to the sputtered particles on the wafer W using the oxidizing gas part 56 after the target T made of a metal material (e.g., Mg) is subjected to sputtering (step S7). Accordingly, the sputtered particles are oxidized, and a metal oxide film can be formed by the film forming apparatus 1.

On the other hand, if it is determined that it is necessary to end the film formation (step S8: YES), the controller 80 proceeds from the processing flow of the film forming method to the process of unloading the wafer W.

Next, the operations of the magnets 71 respectively provided for the plurality of targets T in step S5 will be described. Here, it is assumed that the target T made of a magnetic material (e.g., Co, Fr, or Ni) is selected as the selected target Ts. When the selected target Ts and the plurality of unselected targets Tns are set (step S3 of FIG. 6), the controller 80 controls the magnet 71 disposed at the selected target Ts and the magnets 71 disposed at the unselected targets Tns to perform different operations.

Figure 7:
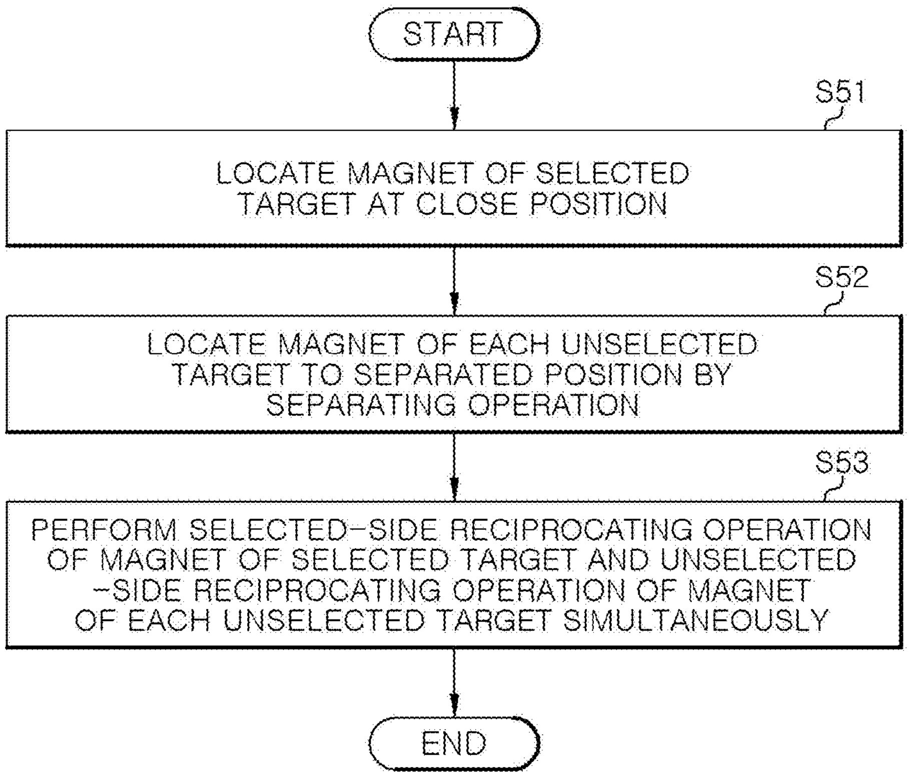
FIG. 7 is a flowchart showing an operation of multiple magnets.

FIG. 7 is a flowchart showing the operations of the plurality of magnets 71. As shown in FIG. 7, the controller 80 controls the approaching/separating mechanism 75 to perform an approaching operation on the magnet 71 of the selected target Ts to locate the magnet 71 of the selected target Ts at the close position AP (step S51). If the magnet 71 of the selected target Ts is originally located at the close position AP before the operation of the magnet 71 of the selected target Ts is started, the approaching operation may not be performed.

On the other hand, the controller 80 controls each approaching/separating mechanism 75 to perform a separating operation on the magnet 71 of each unselected target Tns to locate the magnet 71 of each unselected target Tns at the separated position EP (step S52). If the magnet 71 of each unselected target Tns is originally located at the separated position EP before the operation of the corresponding magnet 71 is started, the separating operation may not be performed.

Further, the controller 80 simultaneously performs the selected-side reciprocating operation in which the magnet 71 of the selected target Ts reciprocates by the reciprocating mechanism 74, and the unselected-side reciprocating operation in which the magnet 71 of each unselected target Tns reciprocates by each reciprocating mechanism 74 (step S53).

In other words, the magnet 71 of the selected target Ts reciprocates in parallel to the longitudinal direction of the selected target Ts at the close position AP (see also FIG. 4). On the other hand, in the unselected-side reciprocating operation, the magnet 71 of each unselected target Tns reciprocates in parallel to the longitudinal direction of each unselected target Tns at the separated position EP (see also FIG. 5). Accordingly, in the film forming apparatus 1, the reciprocating movement of all the magnets 71 respectively disposed at the plurality of targets T is started before the sputtering is started, and the reciprocating movement of each magnet 71 is continued even during the sputtering.

Figure 8A:
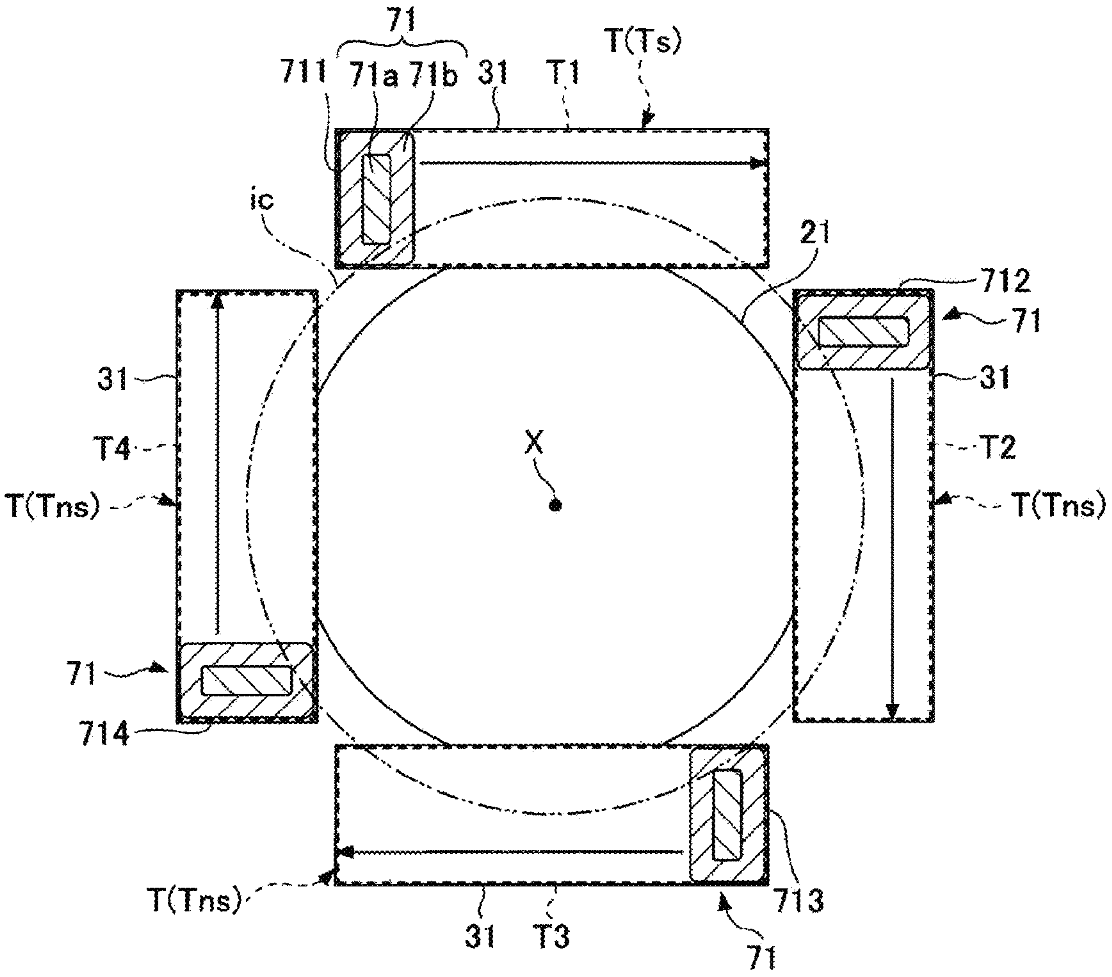
FIG. 8A is a first explanatory diagram illustrating an operation of multiple magnets in sputtering.
Figure 8B:
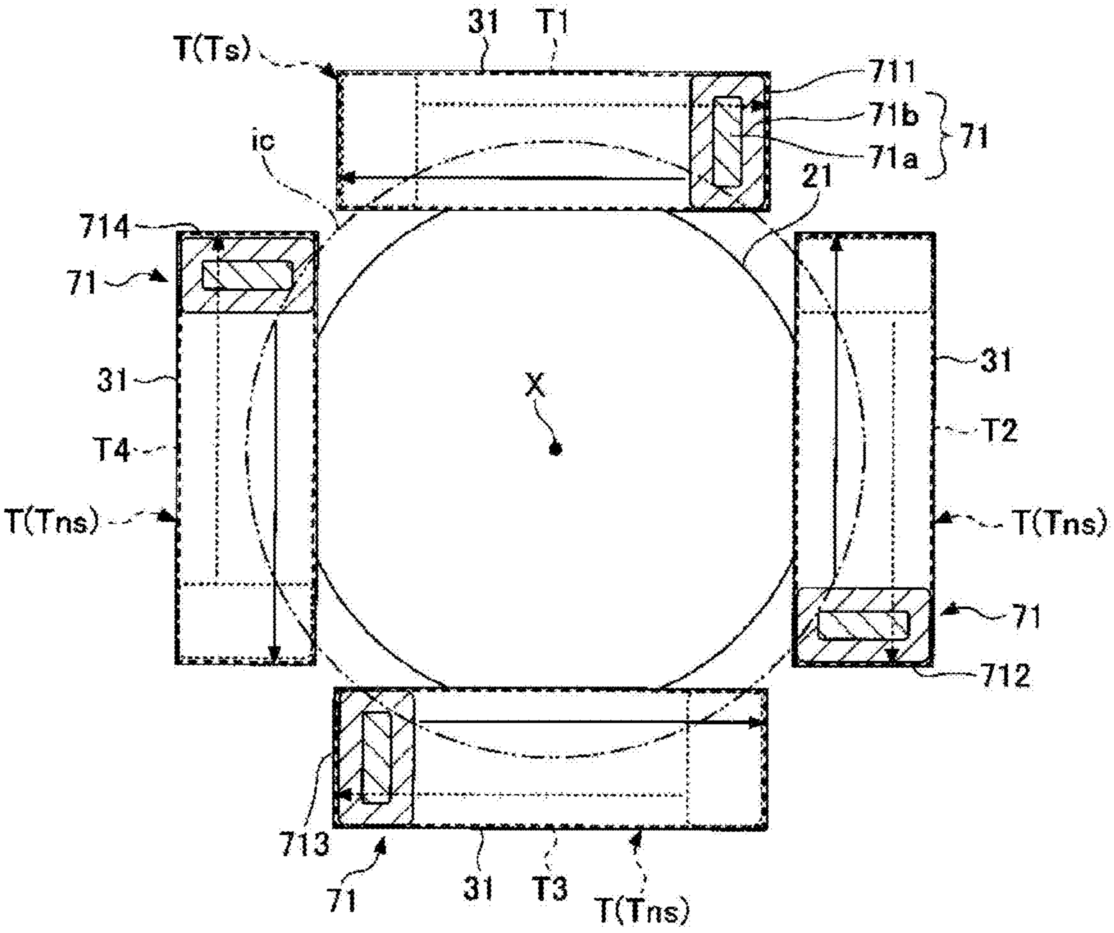
FIG. 8B is a second explanatory diagram illustrating an operation of multiple magnets in the sputtering.

Further, the controller 80 performs a synchronous operation of synchronizing the movements of all the magnets 71 in the operations of the magnets 71. FIG. 8A is a first explanatory diagram illustrating the operations of the plurality of magnets in the sputtering. FIG. 8B is a second explanatory diagram illustrating the operations of the plurality of magnets in the sputtering.

As shown in FIG. 8A, the controller 80 controls the reciprocating mechanisms 74 to reciprocate the plurality of magnets 71 at the same time along the first direction. For example, even when the selected target Ts is the first target T1 and the first magnet 711 moves rightward (in the first direction) at a predetermined speed, the second magnet 712 moves downward (in the first direction) at the same speed as that of the first magnet 711. Similarly, the third magnet 713 moves leftward (in the first direction) at the same speed as that of the first magnet 711, and the fourth magnet 714 moves upward (in the first direction) at the same speed as that of the first magnet 711.

Accordingly, the magnets 71 (the first magnet 711, the second magnet 712, the third magnet 713, and the fourth magnet 714) reach the movement ends in the respective first directions at the same timing. Therefore, in the respective magnets 71, the switching between the first direction and the second direction can be performed at the same time.

As shown in FIG. 8B, even when the first magnet 711 moves leftward (in the second direction) while maintaining a predetermined speed, the second magnet 712 moves upward (in the second direction) at the same speed as that of the first magnet 711. Similarly, the third magnet 713 moves rightward (in the second direction) at the same speed as that of the first magnet 711, and the fourth magnet 714 moves downward (in the second direction) at the same speed as that of the first magnet 711.

In other words, when the magnet 71 of the selected target Ts moves in the first direction in the selected-side reciprocating operation, the magnet 71 of each unselected target Tns also moves in the first direction in the unselected-side reciprocating operation. Reversely, when the magnet 71 of the selected target Ts moves in the second direction in the selected-side reciprocating operation, the magnet 71 of each unselected target Tns also moves in the second direction in the unselected-side reciprocating operation. Since the operations of the plurality of magnets 71 are synchronized by the controller 80, a considerable change in the gap between adjacent magnets 71 along the circumferential direction of the virtual perfect circle IC can be prevented.

As shown in FIG. 4, the magnetic field H of the magnet 71 of the selected target Ts located at the close position AP passes through the selected target Ts, and considerably affects the inner space 10*a* as the surface magnetic field of the selected target Ts. The plasma in the inner space 10*a* is guided to the selected target Ts by the surface magnetic field of the selected target Ts. Further, the magnet 71 of the selected target Ts is displaced along the longitudinal direction of the selected target Ts by the selected-side reciprocating operation, so that positive ions in the plasma can be guided to the entire surface of the selected target Ts.

On the other hand, as shown in FIG. 5, the magnetic field H of the magnet 71 of each unselected target Tns located at the separated position EP is considerably decreased with respect to the inner space 10*a* and the unselected target Tns where each magnet 71 is disposed. For example, the surface magnetic field of each unselected target Tns is 10 Oe or less. Therefore, in the film forming apparatus 1, the influence of the surface magnetic field of each unselected target Tns on the processing chamber 10 can be reduced.

Further, by performing the unselected-side reciprocating operation (synchronous operation) together with the selected-side reciprocating operation, the reciprocating movement of each magnet 71 can be repeated without a considerable change in the mutual gap of the four magnets 71. Accordingly, even if the surface magnetic field of each unselected target Tns slightly leaks to the inner space 10*a*, it is possible to suppress the magnetic field H generated in the inner space 10*a* from becoming unstable due to the mutual influence of the magnetic fields H of the magnets 71.

Here, a configuration in which only the magnet 71 of the selected target Ts reciprocates and each magnet 71 of each unselected target Tns is stopped at the close position AP will be described as a film forming apparatus according to a comparative example. In the film forming apparatus according to the comparative example, when the magnet 71 of the selected target Ts reciprocates, the magnet 71 of the selected target Ts becomes close to the magnet 71 of the unselected target Tns that is stopped. Therefore, the magnetic fields H of the magnet 71 of the selected target Ts and the magnet 71 of the unselected target Tns interact with each other in the processing chamber 10, so that the selected target Ts and its vicinity are affected by the change in the magnetic field H.

For example, the sputtered particles released from the selected target Ts made of a magnetic material by the sputtering may be trapped by the magnetic field H of the unselected target Tns and become particles deposited in a wire (whisker) shape. In particular, such particles are likely to be generated near the opening 41*a* of the shutter main body 41. When the particles fall onto the wafer W, they become impurities that reduce the accuracy of film formation on the wafer W. Further, the particles cause arc discharge in the processing chamber 10 and inhibit stable discharge of plasma.

On the other hand, in the film forming apparatus 1 according to the present embodiment, the interaction between the magnetic field H of each magnet 71 of each unselected target Tns and the magnetic field H of the magnet 71 of the selected target Ts is suppressed. Therefore, the sputtered particles released from the selected target Ts of the magnetic material by the sputtering are prevented from being trapped by the magnetic field H of the unselected target Tns, thereby suppressing the generation of particles. Accordingly, the film forming apparatus 1 can stabilize plasma discharge, thereby improving the accuracy of film formation on the wafer W.

The film forming apparatus 1 includes a detector (not shown) for detecting the current position of each magnet 71, and may perform feedback control of the movement speed or the movement amount of each magnet 71 based on the position detected by the detector. Further, the controller 80 may perform a process of synchronizing the operations of the magnets 71 again when the relative positions of the magnets 71 are changed (when the synchronization is lost). For example, in this process, the magnet 71 that has reached one end in the longitudinal direction stands by until each magnet 71 moves to one end in the longitudinal direction of each target T, and the synchronous operation is started again when all the magnets 71 reach one end in the longitudinal direction.

The film forming apparatus 1 is not limited to the above embodiment, and may perform only one of the unselected-side reciprocating operation in which the magnets 71 of the plurality of unselected targets Tns reciprocate, and the separating operation in which the magnet 71 is separated from the plurality of unselected targets Tns. For example, even if the film forming apparatus 1 performs only the unselected-side reciprocating operation, it is possible to suppress the interaction between the magnetic field H of the magnet 71 of each unselected target Tns and the magnetic field H of the magnet 71 of the selected target Ts. Therefore, the magnetic field H in the inner space 10*a* becomes stable, and the generation of particles is suppressed. For example, even if the film forming apparatus 1 performs only the separating operation, the magnetic field H of each magnet 71 with respect to the plurality of unselected targets Tns becomes considerably weak, which makes it possible to stabilize the magnetic field H in the inner space 10*a*.

Further, the film forming apparatus 1 includes the approaching/separating mechanism 75 for each operation part 72 for operating each magnet 71, so that the magnetic field H of each magnet 71 with respect to each target T can be appropriately adjusted. For example, in the film forming apparatus 1, the gap between each target T and each magnet 71 is adjusted by the approaching/separating mechanism 75 depending on types of targets T for sputtering. Accordingly, the target T can generate surface magnetic field suitable for the type of the corresponding target T in the inner space 10*a* during the sputtering. In other words, the film forming apparatus 1 can stabilize the magnetic field in the inner space 10*a* and perform film formation with higher precision due to the presence of the approaching/separating mechanism 75.

Further, the controller 80 refers to a recipe, or the like so that each magnet 71 operates when the selected target Ts is a magnetic material and each magnet 71 may not operate when the selected target Ts is a non-magnetic material. This is because when the selected target Ts is a non-magnetic material, the sputtered particles fall without being affected by the magnetic field of the magnet 71 of the unselected target Tns. Even when the selected target Ts is a non-magnetic material, the film forming apparatus 1 may operate the magnets 71 of the unselected targets Tns, which makes it possible to easily maintain the relative positions of the magnets 71.

As described above, in the film forming method according to one embodiment, during the sputtering, the selected-side reciprocating operation is performed on the magnet 71 of the selected target Ts and, at the same time, at least one of the unselected-side reciprocating operation and the separating operation is performed on the magnet 71 of the unselected target Tns. Accordingly, in the film forming method, the magnetic field H of the magnet 71 provided for each of the plurality of targets T can become stable in the processing chamber 10. For example, it is possible to suppress sputtered particles generated by the sputtering from being trapped by the magnet 71 of the unselected target Tns. Accordingly, the film formation can be performed with higher precision.

In the film forming method, both the unselected-side reciprocating operation and the separating operation are performed during the sputtering. Accordingly, it is possible to more reliably suppress the interaction between the magnetic field H of the magnet 71 of the unselected target Tns and the magnetic field H of the magnet 71 of the selected target Ts.

Further, in the film forming method, the separating operation is started before the sputtering is started, and the sputtering is started after the selected-side reciprocating operation and the unselected-side reciprocating operation are started. Accordingly, the magnetic field H of each magnet 71 in the processing chamber 10 can become stable before the sputtering is started, which makes it possible to more appropriately perform the sputtering.

Further, the plurality of targets T are arranged along the circumferential direction of the virtual perfect circle IC whose center coincides with, in plan view, the center of the placing table 21 on which the substrate (wafer W) is placed in the inner space 10*a* of the processing chamber 10. In the selected-side reciprocating operation and the unselected-side reciprocating operation, each of the magnets 71 reciprocates along the tangent to the arrangement position of the target T on the virtual perfect circle IC. Accordingly, in the film forming method, the film formation can be appropriately performed on the substrate even in the case of sputtering any target among the plurality of targets T, and the trapping of sputtered particles can be suppressed by the reciprocating movement of the magnet 71 in the unselected-side reciprocating movement.

In the selected-side reciprocating operation and the unselected-side reciprocating operation, the plurality of magnets 71 reciprocate together in the first direction that is parallel to the tangent line and points towards a clockwise direction of the virtual perfect circle IC and the second direction that is parallel to the tangent line and points towards counterclockwise direction of the virtual perfect circle IC. Accordingly, in the film forming method, a considerable change in the gap between the plurality of magnets 71 does not occur, which makes it possible to further stabilize the magnetic field H of the plurality of magnets 71.

In the separating operation, the magnet 71 disposed at the unselected target Tns is moved in a direction perpendicular to the extension direction of the unselected target Tns. Accordingly, in the film forming method, all the magnets 71 can be reliably separated from the unselected targets Tns, which makes it possible to reduce the influence of the magnetic field H of the magnet 71.

Further, in the separating operation, the magnet 71 disposed at the unselected target Tns is moved to a position where the surface magnetic field of the unselected target Tns becomes 10 Oe or less. Accordingly, in the film forming method, the leakage magnetic field from the unselected target Tns is sufficiently suppressed, which makes it possible to reliably stabilize the magnetic field H in the processing chamber 10.

Further, the selected target Ts is a magnetic material. Accordingly, by performing the unselected-side reciprocating operation or the separating operation during the sputtering, it is possible to suppress the influence of the magnetic field H of the magnet 71 of the unselected target Tns on the sputtered particles of the selected target Ts that is a magnetic material.

Further, one aspect of the present disclosure provides the film forming apparatus 1 including the processing chamber 10, the plurality of sputtering targets T disposed in the processing chamber 10, the plurality of magnets 71 respectively provided for the plurality of targets T, the operation parts 72 respectively provided for the plurality of magnets 71 and configured to operate the plurality of magnets 71, and the controller 80 for controlling the operation parts 72. The operation part 72 includes the reciprocating mechanism 74 for reciprocating the magnet 71 in parallel to the extension direction of the target T where the corresponding magnet 71 is disposed, and the approaching/separating mechanism 75 for moving the magnet 71 to be close to or separated from the target T where the corresponding magnet 71 is disposed. Accordingly, the film forming apparatus 1 can perform film formation with higher precision by appropriately adjusting the magnetic field H of each magnet 71 with respect to the plurality of targets T and stabilizing the magnetic field of each magnet 71.

Further, the controller 80 performs, during the sputtering for sputtering the selected target Ts among the plurality of targets T, the selected-side reciprocating operation in which the magnet 71 disposed at the selected target Ts reciprocates in parallel to the extension direction of the selected target Ts and, at the same time, performs at least one of the unselected-side reciprocating operation in which the magnet 71 disposed at the unselected target Ts reciprocates in parallel to the extension direction of the selected target Ts and the separating operation in which the magnet 71 disposed at the unselected target Tns is separated from the unselected target Tns. Accordingly, the film forming apparatus 1 can further stabilize the magnetic field of each magnet 71.

It should be noted that the film forming apparatus 1 according to the embodiments of the present disclosure are illustrative in all respects and are not restrictive. The above-described embodiments can be variously modified and improved without departing from the scope of the appended claims and the gist thereof. The above-described embodiments may include other configurations without contradicting each other, and may be combined without contradicting each other.

This application claims priority to Japanese Patent Application No. 2021-101031, filed on Jun. 17, 2021, the entire contents of which are incorporated herein by reference.

DESCRIPTION OF REFERENCE NUMERALS

1: film forming apparatus
10: processing chamber
10*a*: inner space
31: holder
71: magnet
72: operation part
74: reciprocating mechanism
75: approaching/separating mechanism
80: controller
ic: virtual perfect circle
T: target
Tns: unselected target
Ts: selected target

The invention claimed is:

1. A film forming method for a film forming apparatus which includes a processing chamber, a plurality of sputtering targets disposed in the processing chamber, a plurality of magnets respectively disposed at the plurality of sputtering targets, and a detector configured to detect a current position of each of the plurality of magnets, the film forming method comprising:

during a sputtering process in which a selected target selected among the plurality of sputtering targets is subjected to sputtering, performing a selected-side reciprocating operation in which among the plurality of magnets, a first magnet disposed at the selected target reciprocates in parallel to an extension direction of the selected target;

at a same time, performing an unselected-side reciprocating operation in which among the plurality of magnets, a second magnet disposed at an unselected target that is not subjected to the sputtering among the plurality of sputtering targets reciprocates in parallel to an extension direction of the unselected target such that a change in a gap between the first magnet and the second magnet is suppressed; and performing feedback control of a movement speed or a movement amount of each of the plurality of magnets based on the current position of each of the plurality of magnets detected by the detector.

2. The film forming method of claim 1, wherein during the sputtering, both the unselected-side reciprocating operation and a separating operation in which the second magnet is separated from the unselected target are performed.

3. The film forming method of claim 2, wherein the separating operation is performed before the sputtering is started, and the sputtering is performed after the selected-side reciprocating operation and the unselected-side reciprocating operation are started.

4. The film forming method of claim 2, wherein in the separating operation, the second magnet disposed at the unselected target is moved in a direction perpendicular to the extension direction of the unselected target.

5. The film forming method of claim 2, wherein in the separating operation, the second magnet disposed at the unselected target is moved to a position where surface magnetic field of the unselected target is 10 Oe or less.

6. The film forming method of claim 1, wherein the plurality of sputtering targets are arranged along a circumferential direction of a virtual perfect circle so that a long side of each of the plurality of sputtering targets is parallel to a tangent line of the virtual perfect circle, a center of the virtual perfect circle coincides with, in plan view, a center of a placing table on which a substrate is placed in an inner space of the processing chamber, and in the selected-side reciprocating operation and the unselected-side reciprocating operation, each of the plurality of magnets reciprocates along the long side of a corresponding sputtering target from the plurality of sputtering targets.

7. The film forming method of claim 6, wherein in the selected-side reciprocating operation and the unselected-side reciprocating operation, the plurality of magnets reciprocate together in a first direction that is parallel to the tangent line and points towards a clockwise direction of the virtual perfect circle and a second direction that is parallel to the tangent line and points towards a counterclockwise direction of the virtual perfect circle.

8. The film forming method of claim 1, wherein the selected target is a magnetic material.

9. A film forming apparatus comprising:

a processing chamber;

a plurality of sputtering targets disposed in the processing chamber;

a plurality of magnets respectively disposed at the plurality of sputtering targets, wherein the plurality of magnets comprises a first magnet and a second magnet;

a plurality of operation parts respectively provided for the plurality of magnets and configured to operate the plurality of magnets;

a detector configured to detect a current position of each of the plurality of magnets; and a controller configured to control the plurality of operation parts, wherein each of the plurality of operation parts includes:

a reciprocating mechanism configured to reciprocate a corresponding magnet from the plurality of magnets in parallel to an extension direction of a target where the corresponding magnet is disposed, wherein during a sputtering process in which a selected target selected among the plurality of sputtering targets is subjected to sputtering, the reciprocating mechanism corresponding to the first magnet is configured to reciprocate the first magnet disposed at the selected target and, at a same time, the reciprocating mechanism corresponding to the second magnet is configured to reciprocate the second magnet disposed at an unselected target that is not subjected to the sputtering among the plurality of sputtering targets such that a change in a gap between the first magnet and the second magnet is suppressed and wherein the controller is configured to perform feedback control of a movement speed or a movement amount of each of the plurality of magnets based on the current position of each of the plurality of magnets detected by the detector such that the change in the gap between the first magnet and the second magnet is suppressed.

10. The film forming apparatus of claim 9, wherein each of the plurality of operation parts further includes an approaching/separating mechanism configured to move the corresponding magnet close to or separated from the target, wherein during the sputtering process, among the approaching/separating mechanisms, an approaching/separating mechanism corresponding to the second magnet is configured to perform a separating operation in which the second magnet is separated from the unselected target.

* * * * *